United States Patent
Zhang et al.

(10) Patent No.: US 8,240,790 B2
(45) Date of Patent: Aug. 14, 2012

(54) SLIDE RAIL

(75) Inventors: Guang-Yi Zhang, Shenzhen (CN); Lin-Ren Gu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/916,622

(22) Filed: Oct. 31, 2010

(65) Prior Publication Data

US 2012/0076445 A1 Mar. 29, 2012

(30) Foreign Application Priority Data

Sep. 29, 2010 (CN) .......................... 2010 1 0296649

(51) Int. Cl.
*A47B 88/00* (2006.01)
(52) U.S. Cl. ................... 312/334.8; 312/334.44
(58) Field of Classification Search ............... 312/334.8, 312/334.7, 333, 334.44; 384/20, 21
See application file for complete search history.

(56) References Cited

U.S. PATENT DOCUMENTS

| | | | | |
|---|---|---|---|---|
| 4,872,734 A | * | 10/1989 | Rechberg | 312/333 |
| 5,466,060 A | * | 11/1995 | Hoffman | 312/334.8 |
| 6,375,290 B1 | * | 4/2002 | Lin et al. | 312/334.46 |
| 6,464,311 B2 | * | 10/2002 | Liang et al. | 312/334.46 |
| 2006/0066190 A1 | * | 3/2006 | Hay | 312/333 |
| 2008/0191593 A1 | * | 8/2008 | Huang et al. | 312/334.1 |
| 2009/0169140 A1 | * | 7/2009 | Chen et al. | 384/21 |

* cited by examiner

*Primary Examiner* — Darnell Jayne
*Assistant Examiner* — Andres F Gallego
(74) *Attorney, Agent, or Firm* — Altis Law Group, Inc.

(57) ABSTRACT

A slide rail includes a first slide and a second slide received in the first slide. The first slide includes a first main plate and two first side parts symmetrically placed on two opposite sides of the first main plate. The second slide includes a main body, an extending body received in the main body, and a slide post. The main body includes a second main plate and two second side parts symmetrically placed on two opposite sides of the second main plate. The second main plate includes a fixed hole defined therein. The extending body includes a third main plate and two third side parts symmetrically placed on two opposite sides of the third main plate. The third main plate defines a rail therein. The slide post is passed through the rail and fixed to the fixed hole.

8 Claims, 5 Drawing Sheets

SLIDE RAIL

BACKGROUND

1. Technical Field

The present disclosure relates to device mounting, and particularly, to a slide rail.

2. Description of Related Art

A commonly used slide rail for mounting a server to a rack includes a first slide mounted to the rack and a second slide mounted to the server. The second slide is extendable relative to the first slide, so that the server can be extended from the rack. However, when the server is extended from the rack, the server may be damaged due to insufficient support strength between the first slide and the second slide.

Therefore, a slide rail is desired to overcome the limitations described.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION

Figure 1:
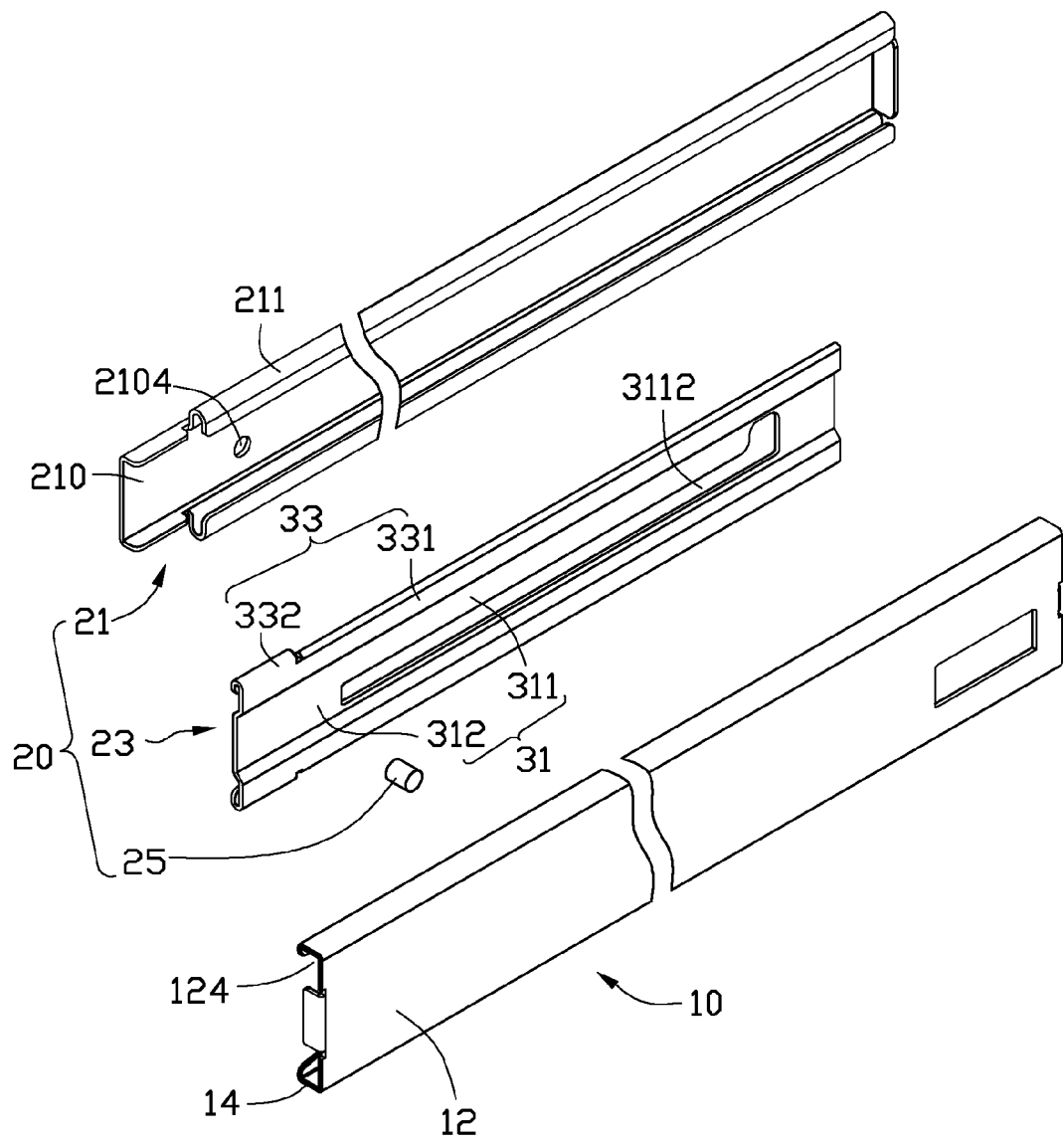
FIG. 1 is an exploded, isometric view of a slide rail according to an exemplary embodiment.
Figure 2:
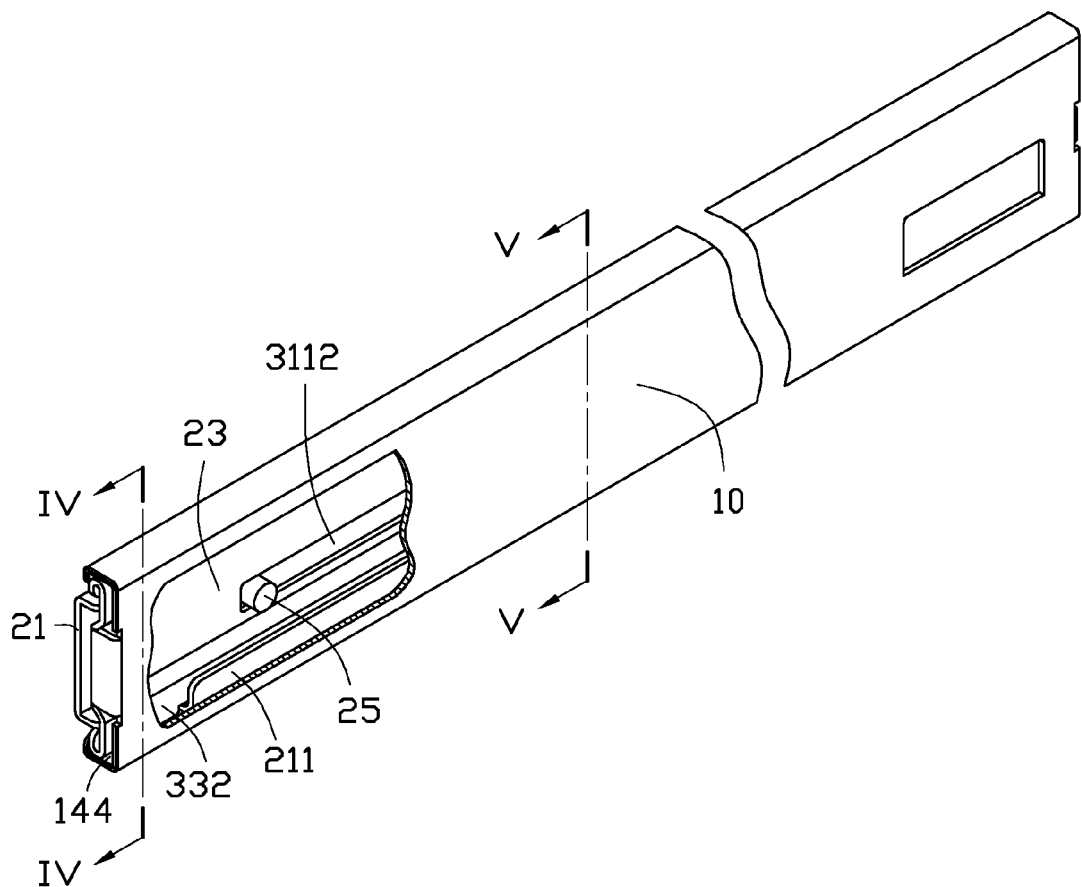
FIG. 2 is an assembled, isometric, cutaway view of FIG. 1 showing a second slide received in a first slide.
Figure 3:
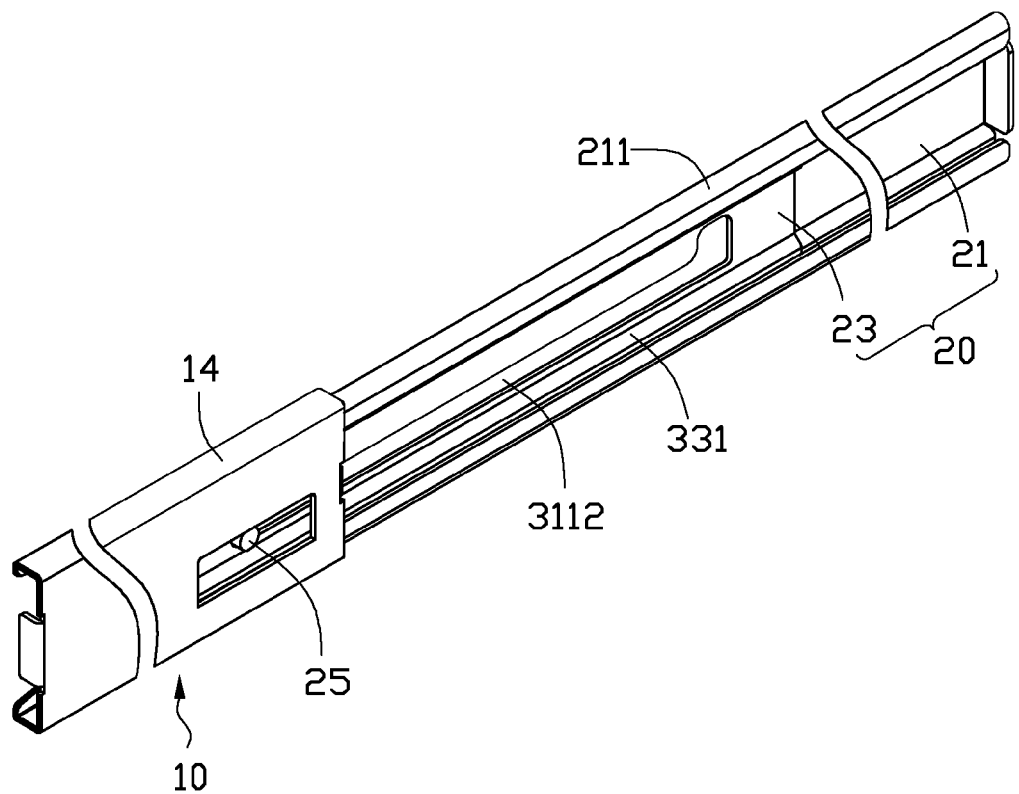
FIG. 3 is an assembled, isometric view of FIG. 1 showing the second slide withdrawn from the first slide.

Referring to FIGS. 1-2, a slide rail, according to an exemplary embodiment, is shown. The slide rail includes a first slide 10 and a second slide 20 received in the first slide 10.

The first slide 10 includes a first main plate 12 and two first side parts 14. The two first side parts 14 are symmetrically placed on two opposite sides of the first main plate 12, integrally extending from the first main plate 12 respectively. A first recess 144 is formed between inner sides of the two first side parts 14. A cross section of the first slide 10 is a C-shaped rectangle.

The second slide 20 includes a main body 21, an extending body 23, and a slide post 25.

Figure 5:
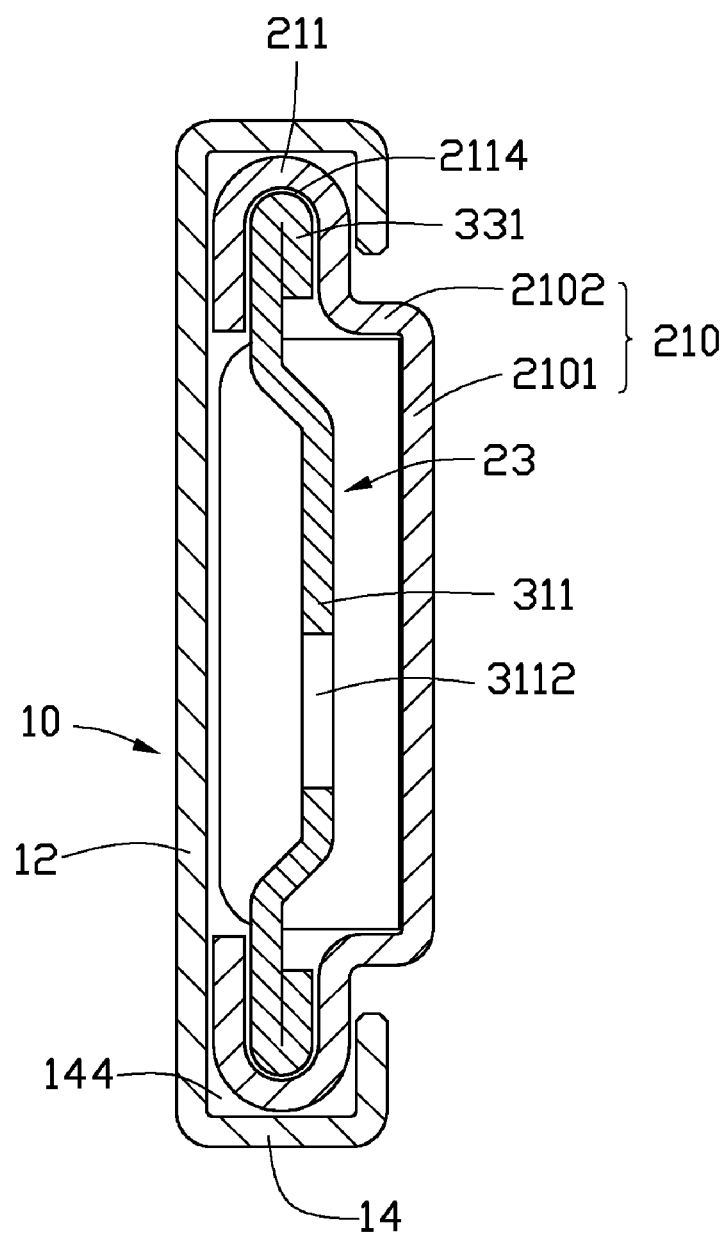
FIG. 5 is a cross section of FIG. 2, taken along line V-V thereof.

Referring to FIGS. 1 and 5, the main body 21 of the second slide 20 includes second main plate 210 and two second side parts 211. The two second side parts 211 are symmetrically placed on two opposite sides of the second main plate 210, integrally extending from the second main plate 210 respectively. The second main plate 210 includes a connection portion 2101 and two curved portions 2102 fixed on two ends of the connection portion 2101. The second main plate 210 includes a fixed hole 2104 defined therein. The two second side parts 211 are fixed to the two curved portions 2102 and respectively turned inward to be essentially parallel with the connection portion 2101. A second recess 2114 is thus formed between inner sides of the two second side parts 211. The second main plate 210 is longer than each of the two second side parts 211.

Figure 4:
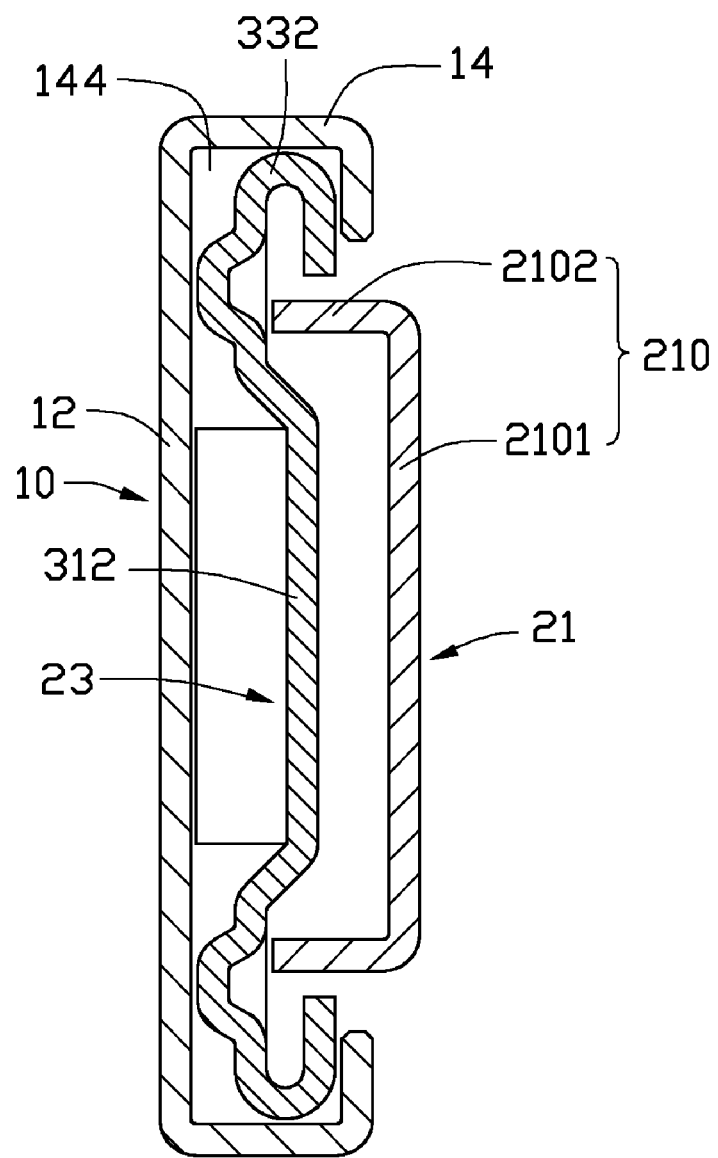
FIG. 4 is a cross section of FIG. 2, taken along line IV-IV thereof.

Referring to FIGS. 1, 4 and 5, the extending body 23 includes a third main plate 31 and two third side parts 33. The two third side parts 33 are symmetrical on two opposite sides of the third main plate 31, integrally extending from the third main plate 31 respectively. The third main plate 31 includes a first plate 311 defined on a front end thereof and a second plate 312 defined on a rear end thereof. The first plate 311 and the second plate 312 are connected in that order. The first plate 311 includes a rail 3112 defined along its length. Each of the two third side parts 33 includes a first part portion 331 opposite to the first plate 311, and a second part portion 332 opposite to the second plate 312. The first part portion 331 of each of the two third side parts 33 is fixed to the first plate 311 of the third main plate 31 and turned outward to be essentially parallel with the first plate 311. The second part portion 332 of each of the two third side parts 33 is fixed to the second plate 312 of the third main plate 31 and turned outward to be essentially parallel with the second plate 312. Height of the second part portion 332 exceeds that of the first part portion 331.

A diameter of the slide post 25 is less than a width of the rail 3112 of the extending body 23.

In assembly of the extending body 23 to the main body 21, the first part portion 331 of the extending body 23 is slidably received in the second recess 2114 of the main body 21 until a front end of the second part portion 332 of the extending body 23 reaches a rear end of each of the two second side parts 211 of the main body 21. The rail 3112 of the extending body 23 is aligned with the fixed hole 2104 of the main body 21, and the slide post 25 is passed through the rail 3112 and fixed to the fixed hole 2104. The extending body 23 has the rail 3112 abutting the slide post 25 to maintain the extending body 23 in the main body 21.

In assembly of the second slide 20 to the first slide 10, the second part portion 332 of the extending body 23 and the two second side parts 211 of the main body 21 are slidably received in the first recess 144 of the first slide 10 until the second slide 20 superposes to the first slide 10.

In use, the second slide 20 is withdrawn from a front end of the first slide 10, and the extending body 23 is withdrawn from a rear end of the main body 21 to enhance the support strength between the first slide 10 and second slide 20.

While the disclosure has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A slide rail comprising:
a first slide comprising a first main plate and two first side parts symmetrically placed on two opposite sides of the first main plate, wherein inner sides of the two first side parts define a first recess therein; and
a second slide comprising:
a main body slidably engaged in the first recess of the first slide, and comprising a second main plate and two second side parts symmetrically placed on two opposite sides of the second main plate, wherein inner sides of the two side parts define a second recess therein;
an extending body comprising a third main plate and two third side parts symmetrically placed on two opposite sides of the third main plate;

wherein the third main plate comprises a first plate and a second plate extending from an end of the first plate along a longitudinal direction of the first plate, each of the third side parts comprises a first part portion extending from a side of the first plate, and a second part portion extending from a side of the second plate, the first part portions and the first plate are slidably engaged in the second recess of main body, the second part portions and the second plate are stopped from entering the second recess by the second side parts, and directly engaged in the first recess of the first slide.

2. The slide rail of claim 1, wherein the two first side parts integrally extend from the first main plate respectively, and wherein a cross section of the first slide is a C-shaped rectangular slide.

3. The slide rail of claim 1, wherein the second main plate comprises a connection portion and two curved portions extending from opposite sides of the connection portion, and wherein the two second side parts respectively extend from the two curved portions and respectively turned inward to be essentially parallel with the connection portion.

4. The slide rail of claim 1, wherein the first part portion of each of the two third side parts is turned outward to be essentially parallel with the first plate, and wherein the second part portion of each of the two third side parts is turned outward to be essentially parallel with the second plate.

5. The slide rail of claim 1, wherein a height of each of the second part portions exceeds a height of each of the first part portions.

6. The slide rail of claim 1, wherein the two second side parts integrally extend from the second main plate respectively.

7. The slide rail of claim 5, wherein the height of each of the second part portion is substantially equal to the height of each of the second side parts.

8. The slide rail of claim 1, wherein the first main plate comprises a rail defined along its length, and the second main plate comprises a fixed hole defined therein; and wherein the second slide further comprises a slide post passed through the rail and fixed to the fixed hole.

* * * * *